(12) United States Patent
Elam et al.

(10) Patent No.: US 8,012,860 B2
(45) Date of Patent: Sep. 6, 2011

(54) ATOMIC LAYER DEPOSITION FOR FUNCTIONALIZING COLLOIDAL AND SEMICONDUCTOR PARTICLES

(75) Inventors: Jeffrey W. Elam, Elmhurst, IL (US);
Philippe Guyot-Sionnest, Chicago, IL (US)

(73) Assignee: UChicago Argonne, LLC, Chicago, IL (US)

( * ) Notice: Subject to any disclaimer, the term of this patent is extended or adjusted under 35 U.S.C. 154(b) by 58 days.

(21) Appl. No.: 12/485,784

(22) Filed: Jun. 16, 2009

(65) Prior Publication Data

US 2009/0315016 A1    Dec. 24, 2009

Related U.S. Application Data

(60) Provisional application No. 61/073,286, filed on Jun. 17, 2008.

(51) Int. Cl.
*H01L 21/20* (2006.01)
*H01L 21/36* (2006.01)
*H01L 21/00* (2006.01)

(52) U.S. Cl. ............... 438/481; 257/14; 257/E21.102; 257/E21.092; 438/22

(58) Field of Classification Search .............. 438/481, 438/479, 22, 222, 226; 257/E21.102, E21.001, 257/E21.092, 14, E21.093, 103, E21.09, 257/E29.071
See application file for complete search history.

(56) References Cited

U.S. PATENT DOCUMENTS

| 6,861,155 | B2 * | 3/2005 | Bawendi et al. | 428/549 |
| 7,470,473 | B2 * | 12/2008 | Eisler et al. | 428/701 |

* cited by examiner

*Primary Examiner* — Walter L Lindsay, Jr.
(74) *Attorney, Agent, or Firm* — Foley & Lardner LLP

(57) ABSTRACT

A method for producing a product of a functionalized nanocomposition colloidal material using atomic layer deposition to coat the colloidal material. The ALD layer comprises an inorganic material which enables improved optical and electrical properties for the nanocomposite.

17 Claims, 12 Drawing Sheets

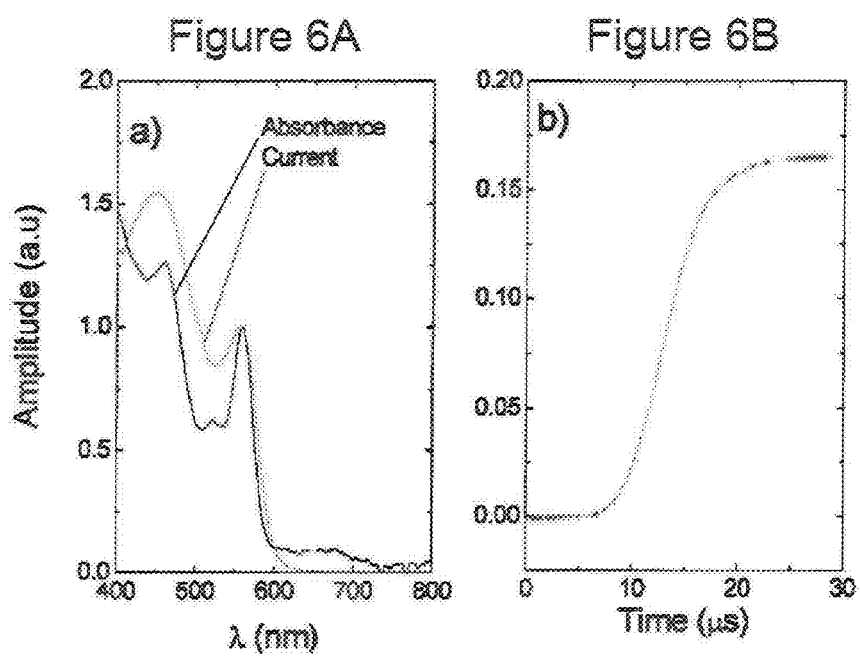
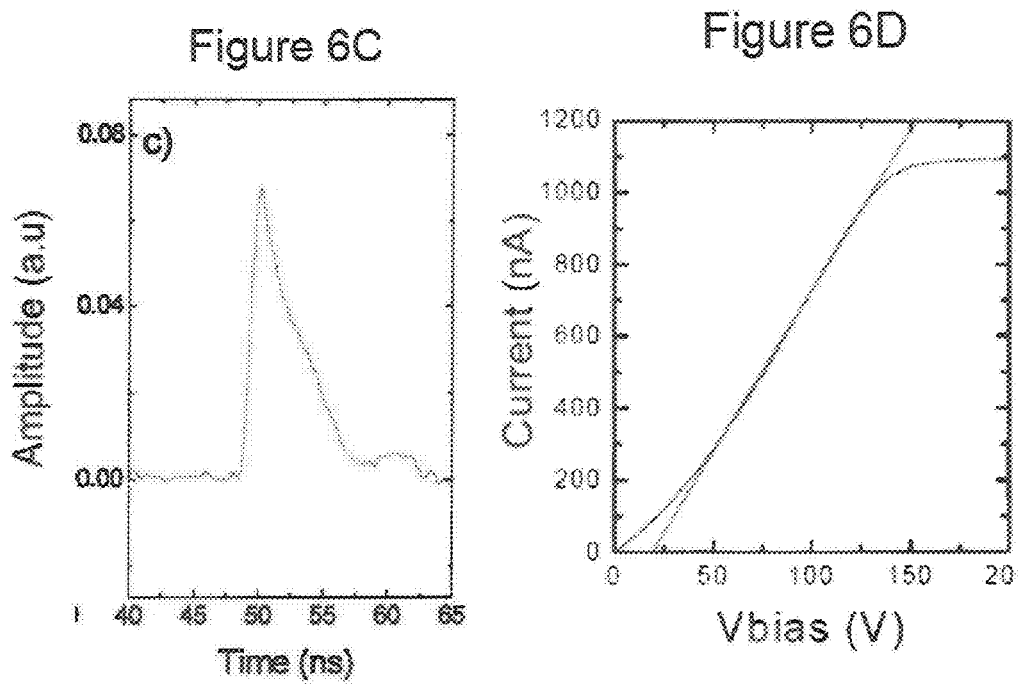

ATOMIC LAYER DEPOSITION FOR FUNCTIONALIZING COLLOIDAL AND SEMICONDUCTOR PARTICLES

CROSS REFERENCE TO RELATED PATENT APPLICATIONS

The present application claims priority to U.S. Provisional Patent Application No. 61/073,286, filed Jun. 17, 2008, and incorporated herein by reference in its entirety.

STATEMENT OF GOVERNMENT INTEREST

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

FIELD OF THE INVENTION

This invention is directed to functionalizing nano-particles using atomic layer deposition (ALD) for a variety of electronic applications. More particularly, the invention is directed to preparation of functionalized nanocomposites of colloidal quantum dots having a deposited layer formed by ALD. A selected film layer can be deposited by ALD to improve electronic properties of the colloidal quantum dots.

BACKGROUND OF THE INVENTION

This section is intended to provide a background or context to the invention that is, inter alia, recited in the claims. Unless otherwise indicated herein, what is described in this section is not prior art to the description and claims in this application and is not admitted to be prior art by inclusion in this section.

Colloidal semiconductor nanoparticles present very interesting optical and electronic properties due to the ease with which the emission wavelength and the electronic states can be controlled. They can further be assembled by a simple drying process into randomly close packed and even highly ordered solids. Because they are synthesized as colloids, they are covered by surfactants that provide a steric repulsion against aggregation. This organic layer has the additional benefit of electronically passivating the dangling orbitals of the metal cations, therefore removing carrier traps and helping radiative recombination of excitons. However, the organic layer also poses a significant barrier to electron transfer between particles. Typically, organic saturated hydrocarbons presents a negative electron affinity, and thus, would lead to typical energy barriers of the order 5 eV for typical semiconductors. In practice, as determined by tunneling experiments on alkane monolayers, the average barrier height is expected to be significantly lower, of the order 2 eV reduced in part by image potentials. Nevertheless, this is a high barrier in the context of traditional semiconductor heterostructures where barriers of 0.5 eV are the norm. Consequently, initial experiments investigating transport with colloidal quantum dot arrays primarily demonstrated their insulating properties.

At present, conductivity in quantum dot arrays has been achieved by a liquid medium procedure that involves the extraction of the original ligands in the films and their replacement by shorter passivating ligands. For CdSe nanocrystals, of interest for visible light emission, the highest mobility reported by this approach is about $10^{-2}$ cm$^2$/V/s. For a smaller band gap material, PbSe, of more interest as an infrared emitter, mobilities of $10^{-2}$ cm$^2$/V/s up to 1 cm$^2$/v/s have been reported. This corresponds to hopping times between 1 nanosecond (ns) and 10 picoseconds (ps) between nanocrystals. This characteristic can also can be expressed in terms of a coupling energy of order 0.01 to 1 meV. This is still small compared to Coulomb repulsive energy or polydispersivity (100 meV). As a result, the organic-inorganic composite nanomaterials made by this approach are intrinsically Mott-insulators.

It is a fundamental challenge to achieve "metallic" behavior in such close-packed arrays. It would also open the door to applications requiring high mobility and high currents, such as electrically driven lasers or photovoltaic devices. Applications of the materials to both cases can be easily motivated. Indeed, the quantum dot lasers based on heteroepitaxy provide insufficient dot density to significantly improve the performance over the existing quantum well laser. With close-packed colloidal dots, dot density is easily increased by 100-fold. The bigger challenge is to draw a high and ambipolar current in the colloidal dot systems. With photovoltaics, such high currents are not required, but it is clear that higher mobilities will be in general very helpful. To overcome the difficulties described hereinbefore due to the organics, a barrier material that is all inorganic has been attempted in the prior art, but has been rather unsuccessful using liquid solution methods. A challenge with liquid solution is to avoid self-nucleation in the liquid phase, as well as pore-clogging in the nanoparticle arrays and to have enough diffusion of the bulky solvated molecules into the array.

SUMMARY OF THE INVENTION

In order to efficiently functionalize useful electronic components from colloidal nanoparticle systems, organic layers conventionally used to coat and passivate the starting nanoparticles are replaced with ALD layers of various inorganic materials. The organic layers present a significant barrier to the flow of electrical charge and the resulting high resistivity limits device application. Replacement of the organic layer with a lower electronic barrier material, such as an inorganic semiconductor, leads to greatly improved electronic coupling between the colloidal nanoparticles, enabling a wide variety of electronic, optical and chemical applications, such as photovoltaics, solid state lighting and electrically driven lasers. A preferred method of preparation involves liquid phase deposition of solid colored colloidal quantum dot arrays followed by gas phase ALD of a selected inorganic barrier layer.

In an embodiment, a method for preparing a functionalized nanocomposite is provided. The method comprises providing an atomic layer deposition (ALD) system, a colloidal quantum dot array that comprises a semiconductor material, providing a first precursor reactive with the semiconductor material, the first precursor comprises at least one of a transition metal and a transition metal compound. The first precursor is selected to modify at least one of an electrical and an optical property of the colloidal quantum dot array. The colloidal quantum dot array is exposed to the first precursor within the ALD system for a first period and a monolayer of the first precursor is deposited over at least a portion of the semiconductor material to form a nanocomposite. The nanocomposite comprises an inorganic surface disposed over at least a portion of the semiconductor material.

In an another embodiment, a functionalized nanocomposite that has enhanced electro-optical properties is described. The nanocomposite comprises a semiconductor nanocrystal substrate and an inorganic conformal film deposited over at least a portion of the substrate via monolayer deposition. The inorganic film comprises a transition metal and the nanocomposite is characterized by an enhancement of at least one of an electrical property and an optical property relative to the respective electrical property and optical property of the semiconductor nanocrystal.

In still another embodiment, a method for enhancing an electro-optical property of a nanocrystal semiconductor is provided. The method comprises providing a nanocrystal semiconductor substantially free of interstitial contaminates and a first precursor. The first precursor comprises at least one of a gas-phase transition metal and a transition metal compound. A second precursor is provided that is selected to be reactive with the first precursor. A substantially conforming layer that comprises the first precursor is deposited onto the nanocrystal semiconductor. The second precursor reacts with the first precursor of the substantially conforming layer to form a nanocomposite structure comprising a nanocrystal semiconductor having an inorganic surface layer.

These and other advantages and features of the invention, together with the organization and manner of operation thereof, will become apparent from the following detailed description when taken in conjunction with the accompanying drawings, wherein like elements have like numerals throughout the several drawings described below.

BRIEF DESCRIPTION OF THE DRAWINGS

FIG. 6A shows photocurrent (light line) as a function of optical wavelength and the absorption spectrum (dark line) of the quantum dot solution; FIG. 6B shows a photocurrent transient response measured with a $10^5$ V/A amplifier and cw laser source interrupted by a rotating chopper; FIG. 6C shows an un-amplified photocurrent response to an 8 ps 532 nm laser pulse measured with a 50 ohm load and a 2 GHz oscilloscope (sizing is due to capacitance and the dotted line is for a 4 ns exponential decay; and FIG. 6D shows the photocurrent versus applied bias;

DETAILED DESCRIPTION OF VARIOUS EMBODIMENTS

Figure 1:
FIG. 1 illustrates a TEM image of a 4 nm ALD $Al_2O_3$ film deposited on $ZrO_2$ nanoparticles with a conformal $Al_2O_3$ film encapsulating the $ZrO_2$ nanoparticles.

Atomic layer deposition (ALD) is a thin film growth method relying on alternating, self-limiting chemical reactions between precursor vapors (for example, A and B components) and a solid surface to deposit films in an atomic layer-by-layer fashion. In this method, each "AB cycle" deposits exactly one monolayer of material and the thickness of the film can be controlled precisely on the atomic level by adjusting the number of AB cycles. Gaseous diffusion of the ALD precursor molecules along with termination of the individual ALD reactions following deposition of each complete layer ensure that the resulting films are conformal and uniform in thickness even when the underlying substrate has a complex topography. Consequently, porous substrates can be coated easily by ALD, including nanoporous membranes, aerogels, micro-electromechanical systems (MEMS), and particles. FIG. 1 illustrates this conformality by showing a transmission electron microscopy (TEM) image of a sample of $ZrO_2$ nanoparticles that have been coated with an ALD $Al_2O_3$ film having a thickness of 4 nm (the outer layer of the nanoparticle).

Figure 2:
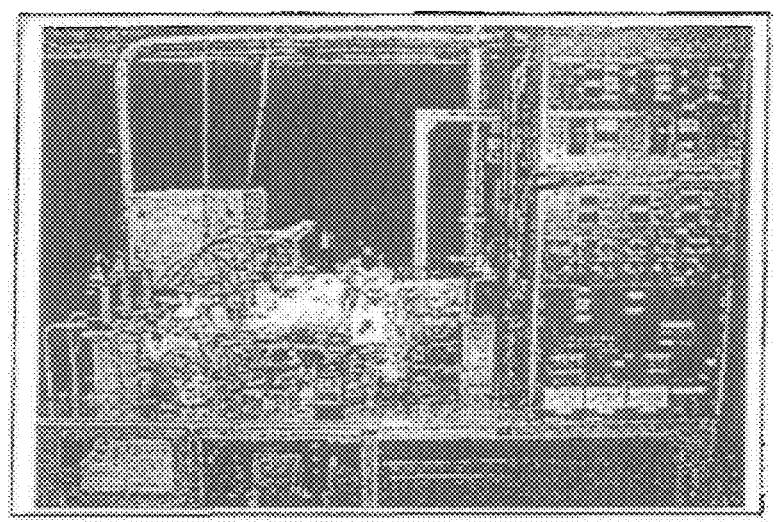
FIG. 2 illustrates a conventional viscous flow ALD reactor used to carry out the process of the invention.

A wide variety of materials can be deposited by ALD methods including oxides, nitrides, and metals. For instance, zinc oxide (ZnO) can be deposited using alternating exposures of diethyl zinc (DEZ) and water vapor; aluminum oxide ($Al_2O_3$) can be deposited using alternating exposures of trimethyl aluminum and water vapor; zinc sulfide (ZnS) can be formed with altering exposures of DEZ and hydrogen sulfide ($H_2S$); and ZnSe may be formed with alternating exposures of DEZ and hydrogen diselenide ($H_2Se$). An ALD viscous flow reactor 100 for synthesizing ZnO films and other ALD materials is shown in FIG. 2 and is a conventional reactor.

Atomic layer deposition (ALD) has been used to apply an inorganic-based layer over an underlying nanoparticle pattern to achieve a resulting component product having superior properties. Films of nanocrystals are well suited for ALD. The open structure of nanocrystal films allows rapid diffusion of the gaseous precursor and thus easy layer by layer filling of the interstices present in such layers. Furthermore, the nanometer (nm) size interstices allow saturation after application of only a few monolayers. Thus a complete ALD process on a film of nanocrystals can take place over only a few cycles, and thus be cost-effective.

ALD may be used to create films of nanocrystals, for example, using colloidal CdSe quantum dots and selected appropriate core/shell structures. In a preferred embodiment to perform ALD within the nanocrystal film, interstices should be as free as possible of hydrocarbons from excess solvent or ligands. Indeed, it is likely that polar gases do not diffuse easily in a hydrophobic matrix and/or that the polar ALD material nucleate incompletely in such an environment. A preferred preparation involves treating the film with a 3% by weight aqueous ammonium hydroxide ($NH_4OH$) (30%) in ethanol. The IR spectra of the $NH_4OH$ treated films shows a much reduced CH contribution albeit with an increased NH/OH contribution. While not limiting the scope of the invention, it is believed that the ammonium ions complexes the surface metal ions, displacing the previous ligands which are then soluble in ethanol. The kinetics of removal of the hydrocarbons, measured by infrared absorption of the CH stretches, indicate at least two time constants, where 80-90% is removed in an immersion of about 30 seconds. The remaining hydrocarbon is removed on a much slower time scale and is accompanied by etching of the film, as evidenced by a blue-shift in the absorption spectrum of the quantum dots. Ellipsometry showed that ligand removal by $NH_4OH$ treatment shrinks the film thickness by about 30% and increases the dielectric constant by about 10%.

Figure 3:
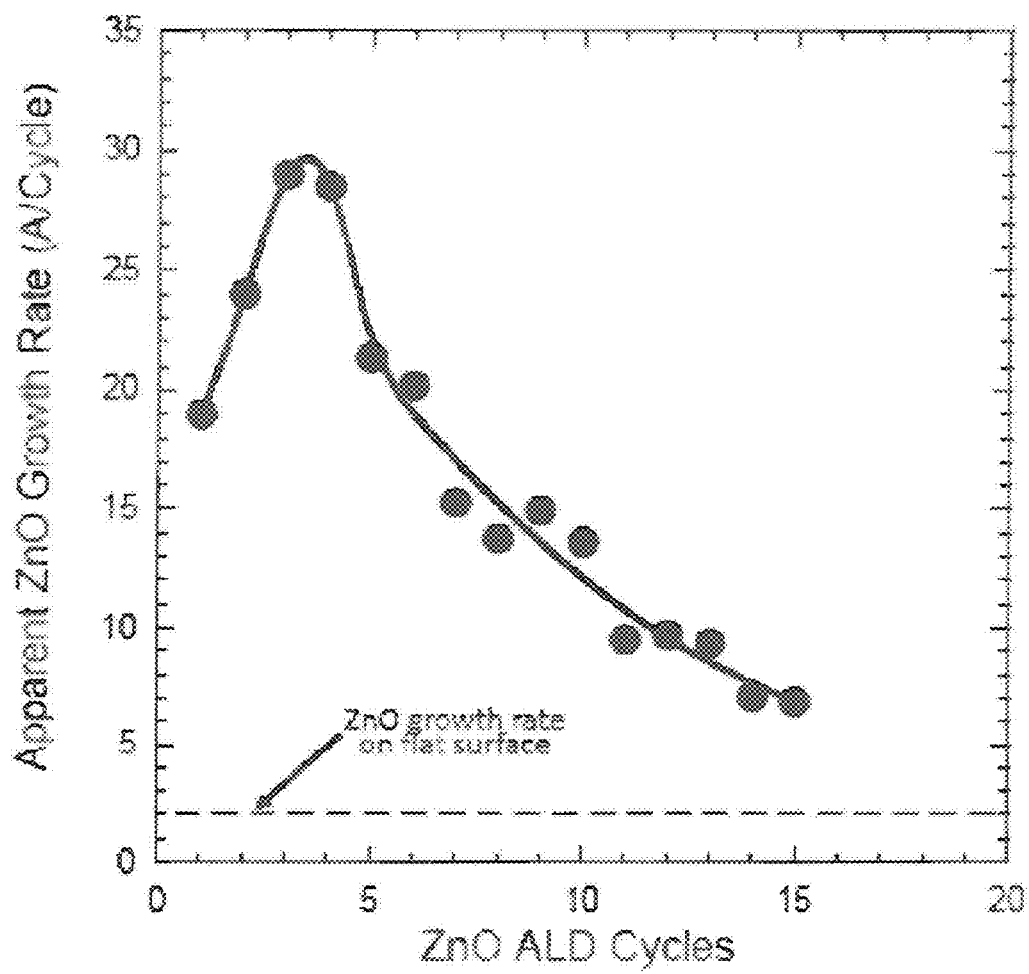
FIG. 3 illustrates a QCM measurement of the mass uptake growth rate after several deposition cycles of ZnO for a CdSe thin film wherein the film was treated with $NH_4OH$.

To evaluate the extent of infiltration by the ZnO ALD, CdSe nanocrystal films (about 50 nm thickness) were drop cast onto quartz sensors which were used for in situ quartz crystal microbalance (QCM) measurements. The initial ZnO ALD mass uptake is close to the value of 113 ng/cm²/cycle measured for a clean sensor. Mass uptake increases slowly in subsequent cycles, indicating only modest infiltration. This behavior is understandable because the dried films contain a large fraction of long, hydrocarbon chain ligands which block the interstitial voids and inhibit nucleation of the ZnO ALD. For effective infiltration, the surfaces and voids should be substantially clear, and the surface should react with the ALD precursors. To improve the infiltration, the films were treated with 3% by weight aqueous ammonium aydroxide (30%) in ethanol. Following $NH_4OH$ treatment of the CdSe films, QCM measurements yielded a significantly higher mass uptake of up to 1400 ng/cm²/cycle, which is the equivalent of 13 ZnO ALD layers (FIG. 3, solid circles). To estimate the maximum possible uptake, the surface area of a film of thickness d containing spheres of radius R at a volume fraction $\Phi$ is $3\Phi d/R$. Assuming a random-close packed fraction of 0.64, a 50 nm film made of 2.5 nm radius particles should have an uptake of about 40×. The measured uptake of 13× may reflect inaccessible surfaces, or delayed nucleation on the nanocrystal surfaces but it does confirm a large degree of infiltration.

The samples with ZnO deposited by ALD were tested for photoconductivity. ZnO is a good choice because it is a natural n-type conductor. Its bulk conduction band edge is expected to be below that of CdSe so that electrons in CdSe may have a low barrier to tunnel to the other nanocrystals and may even be extracted into the ZnO matrix. Furthermore, although ZnO has a strong tendency to trap holes, its ability to conduct electrons is remarkably resilient to disorder, defects or the large amount of hydroxyl groups which result from the ALD process.

Figure 4:
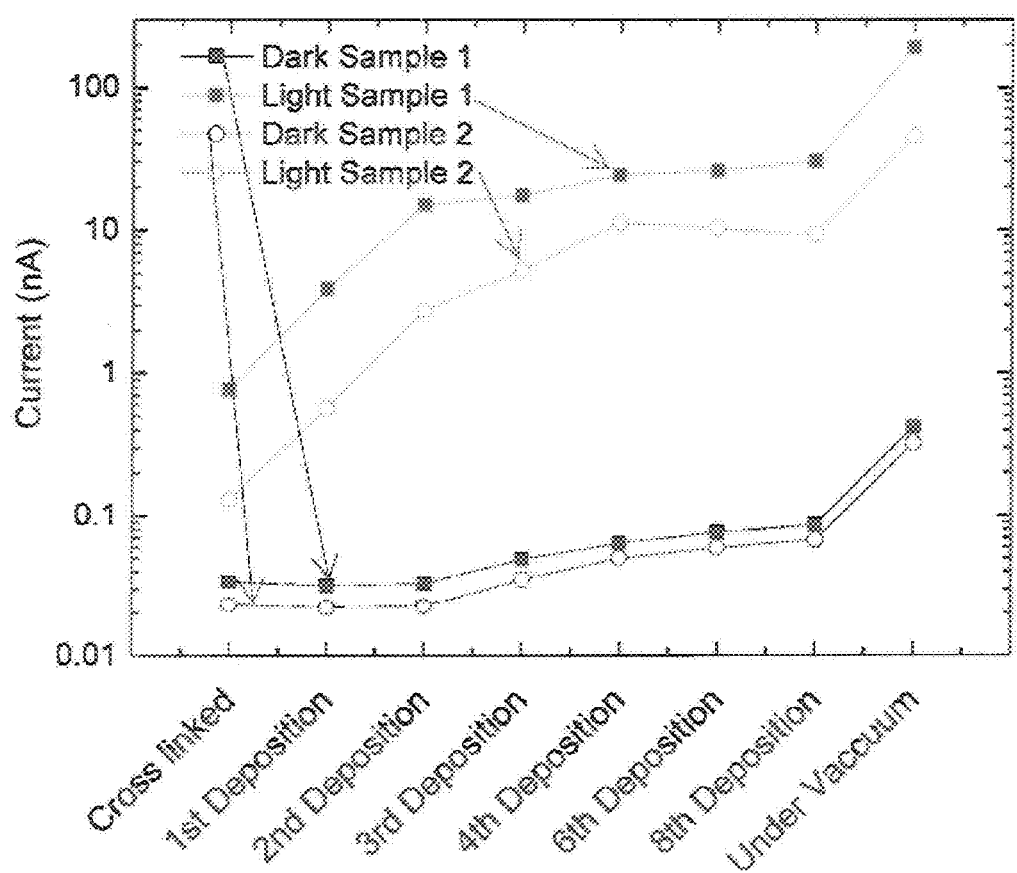
FIG. 4 illustrates photocurrent and dark current measured in air at room temperature after each processing step of a CdSe/CdS specimen.

The sample film of CdSe/CdS colloidal quantum dots is drop cast on a set of interdigitated electrodes (50 sets pf Pt electrodes of 5 mm long, 5 μm wide and 5 μm separation on glass) from Abtech Scientific. FIG. 4 shows the bright and dark conductivity of a sample following the various steps in the treatment and after each ZnO cycle, ending with $H_2O$. The samples were characterized at room temperature in air after each processing step and ZnO cycle. The bias of 1 V and the current/voltage response is perfectly linear from 0 to 1 V. The bright conductivity is simply measured with a 3 V handheld flashlamp and only the relative changes are relevant. As shown in FIG. 4, the photoconductivity increases by three orders of magnitude following application of the first two monolayers, and then increases more slowly. The dark current, which is initially in the pA range does not increase following application of the first ZnO monolayers but then increases noticeably. As to not be limited by theory, the results suggest that the first few monolayers facilitate electron transfer by mostly building $ZnO_x$ bridges between the quantum dots, while the subsequent monolayers lead to an increase of the ZnO matrix connectivity. Depending on the application, one may want to minimize the dark current while maximizing the conductivity, which may be achieved with few ZnO cycles.

Figure 5:
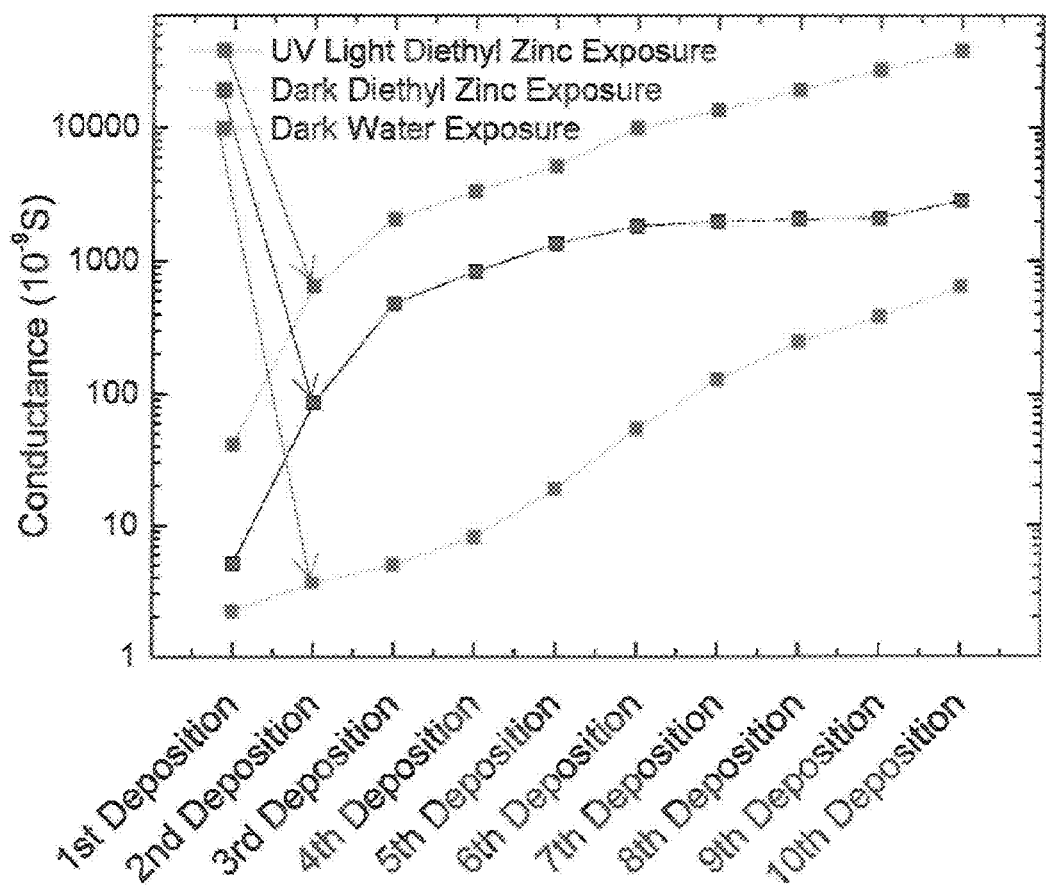
FIG. 5 illustrates conductance of a CdSe/CdS specimen measured in Siemens at 100° C. wherein the upper line data points are under illumination conditions and 10 s after exposure to diethyl zinc, the middle line data points are for 10 s after dark and the lower line data points are for 10 s after exposure to water vapor in the dark.

The dark current and photoconductivity parameters are sensitive to temperature and ambient atmosphere. As shown in FIG. 5, in situ measurements at 100° C. of the photoconductivity during the ALD cycles show large swings in the parameters. For the first cycle, the photoconductivity increases typically 1000-fold upon exposure with diethyl zinc, and subsequently decreases about 30 fold when exposed to water. Also, simply pulling vacuum on the sample while under illumination leads to large changes of the dark current and photoconductivity. Finally, for a sample that had been exposed to 10 ZnO cycles, a temperature increase from 20° C. to 250° C. was determined to result in a reversible three orders of magnitude increase in dark current. These observations, temperature dependence of the dark current and sensitivity to the environment and illumination, have been typically reported only for amorphous or polycrystalline semiconductors such as $InO_x$ and ZnO in particular. While not limiting the scope of the invention, it is likely that these results reflect the ease with which small changes of the local oxidation state can affect the conductivity of these oxides. For example, the significant photocurrent increase upon diethyl zinc exposure is probably a result of partial electron donation of a —O—Zn-ethyl surface specie.

To optimize the quantum dot photoresponse, while minimizing the dark current, additional assessment was carried out on a three monolayer ZnO cycle specimen. FIG. 6A shows the photoresponse of a ~3.5 nm CdSe sample biased with 1 V. The light source was a 100 W tungsten-halogen lamp filtered through a 10 cm monochromator and 1 mm slits. The photoresponse was normalized to the calibrated response of a Si photodiode. The response follows the optical absorption of the film sample with a small red-shift and broadening compared to the starting solution.

The ZnO ALD modified quantum dot photodiode achieved the fastest response time thus far observed for colloidal quantum dot detectors. FIG. 6B shows time traces measured with a $10^5$ V/A amplifier with a green laser (532 nm) focused on a chopper wheel. The rise time of about 10 μs for specimen is limited by the chopper and close to that of the amplifier. FIG. 6C shows the unamplified response to an 8 ps 532 nm laser pulse recorded with a 2 GHz oscilloscope. The quantum dot film response shows a sharp sub-nanosecond rise time with a fall time of about 4 nanoseconds. The response time obtained for the same is 3-4 orders of magnitude faster than previous results with CdSe quantum dot photodiodes. Not to be limited by theory, but the fast response implies that electrons are rapidly recombining with holes in the absence of light while the larger photosensitivity must imply a decent mobility.

For a photoresistor, the current is given by $I=\tau\mu VL^{-2}\eta\alpha eF$, where e is the electron charge, τ is the electron lifetime (3.5 ns), μ is the mobility, η is the carrier generation probability per exciton, α is the absorption, L is the electrode gap (5 μm) and F is the incident photon flux. At 532 nm, the responsivity, current divided by incident power, of the sample in FIG. 6C was 5.7 μA/W with a 1 V bias. The film absorption for the sample was about 10%. Assuming η=1, the mobility is $8.7\times 10^{-3}$ $cm^2V^{-1}s^{-1}$. This result is a lower bound because η may be less than 1. At 100 V bias, the sensitivity increases 3-fold, providing a mobility of about $2.6\times10^{-2}$ $cm^{-2}V^{-1}s^{-1}$. An independent determination of the mobility is obtained from the I-V curve shown in FIG. 6D. The saturation current, $I_{sat}$, corresponds to $\tau\mu VL^{-2}=1$ such that $I_{sat}=\eta\alpha eF$. Assuming that η=1 in the linear and the saturation regimes, the slope of $I/I_{sat}$ in the linear regime is $\tau\mu L^{-2}$ which gives $\tau\mu=2.10^{-9}$ $cm^2V^{-1}$ and a mobility is $6\times10^{-1}$ $cm^2V^{-1}s^{-1}$. The mobilities estimated by two independent methods are thus in satisfactory agreement, in the $10^{-2}$-$10^{-1}$ $cm^2 V^{-1}s^{-1}$ range. This result is 2-3 orders of magnitude higher than previous mobilities measured from photoconductivity and of the order of the highest value observed for n-type CdSe quantum dot films.

Besides the dramatic effect on photoconductivity, ALD also modifies the optical properties of the quantum dot films. The ALD of ZnO in a $NH_4OH$ treated CdSe quantum dot film increases the index of refraction from about 1.75 to about 2 as the interstices are filled with the high index ZnO, thus waveguiding becomes easier.

Figure 7A:
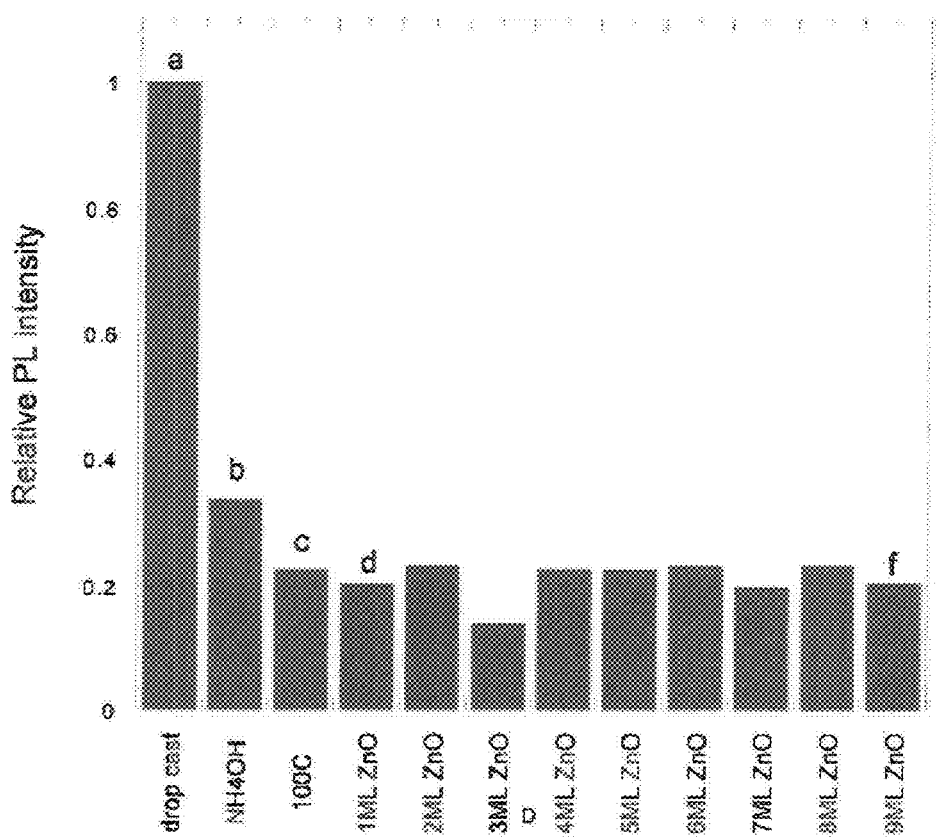
FIGS. 7A and 7B illustrates the effect of film treatment on photoluminescence (PL)
Figure 7B:
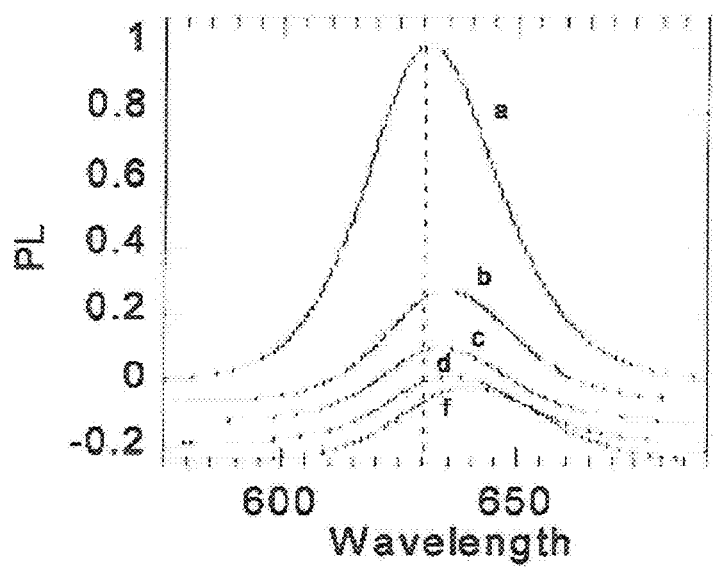

One property that is of great importance for quantum dots is the photoluminescence. It was found that ZnO and $Al_2O_3$ lead to a complete quenching of the luminescence of CdSe quantum dots. In situ measurements show that photoluminescence (PL) is extensively lost upon diethyl zinc exposure. This may be related to the large concurrent increase of photoconductivity, and the partial electron transfer of adsorbed —O—Zn-Ethyl. Indeed, photoluminescence is partially recovered upon $H_2O$ exposure. However, after several cycles, the photoluminescence becomes weak. Core/shell quantum dots are better candidates to prevent charge separation. In agreement with the principal that the electrons are extracted, bright CdSe/CdS quantum dot films loose their photoluminescence upon ZnO ALD exposure at about 100° C. However, Samples of CdSe/ZnS were found to exhibit the greatest resilience of photoluminescence to ZnO. As shown in FIGS. 7A and 7B, for these samples, the most damaging process is the $NH_4OH$ treatment and also heating to 100° C., which together decreased photoluminescence by 75%. Otherwise, the ZnO ALD itself does not lead to significant decline in the photoluminescence.

Finally, it may be noted that the films do not resist acid treatments, and that the ZnO can be removed by simply dipping the films into dilute acetic acid. However, the ALD leads to nanocrystal films with improved mechanical properties. While nanocrystal films before or after $NH_4OH$ treatment are easily wiped off with Qtips, the ALD processed films no longer rub off.

The following non-limiting examples are illustrative of the invention method and products obtained therefrom.

Example 1

Figure 8:
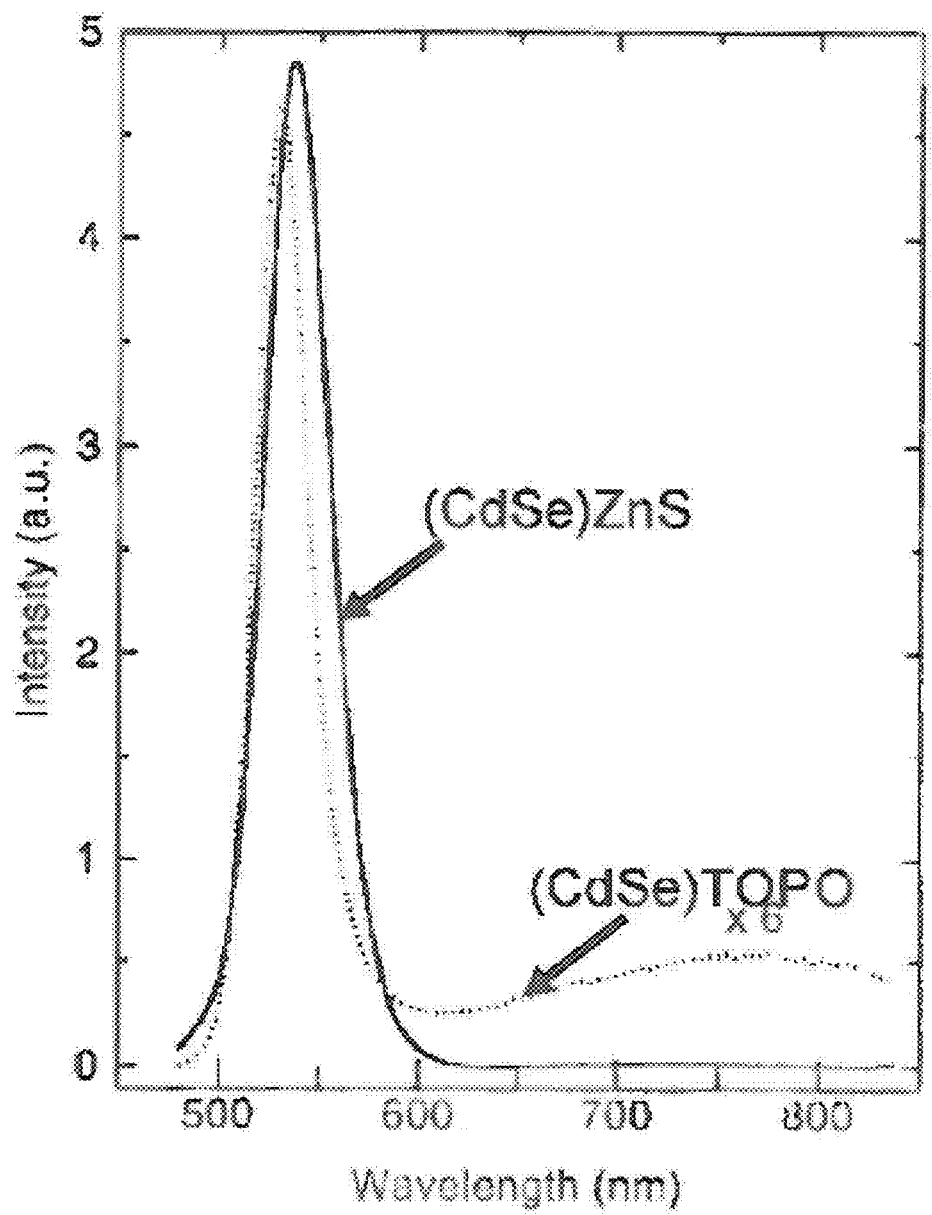
FIG. 8 illustrates a photoluminescence intensity for a core/shell structure of CdSe with ZnS shell and for (CdSe) ZnS and (CdSe) tri-n-octylphosphine oxide (TOPO)
Figure 9:
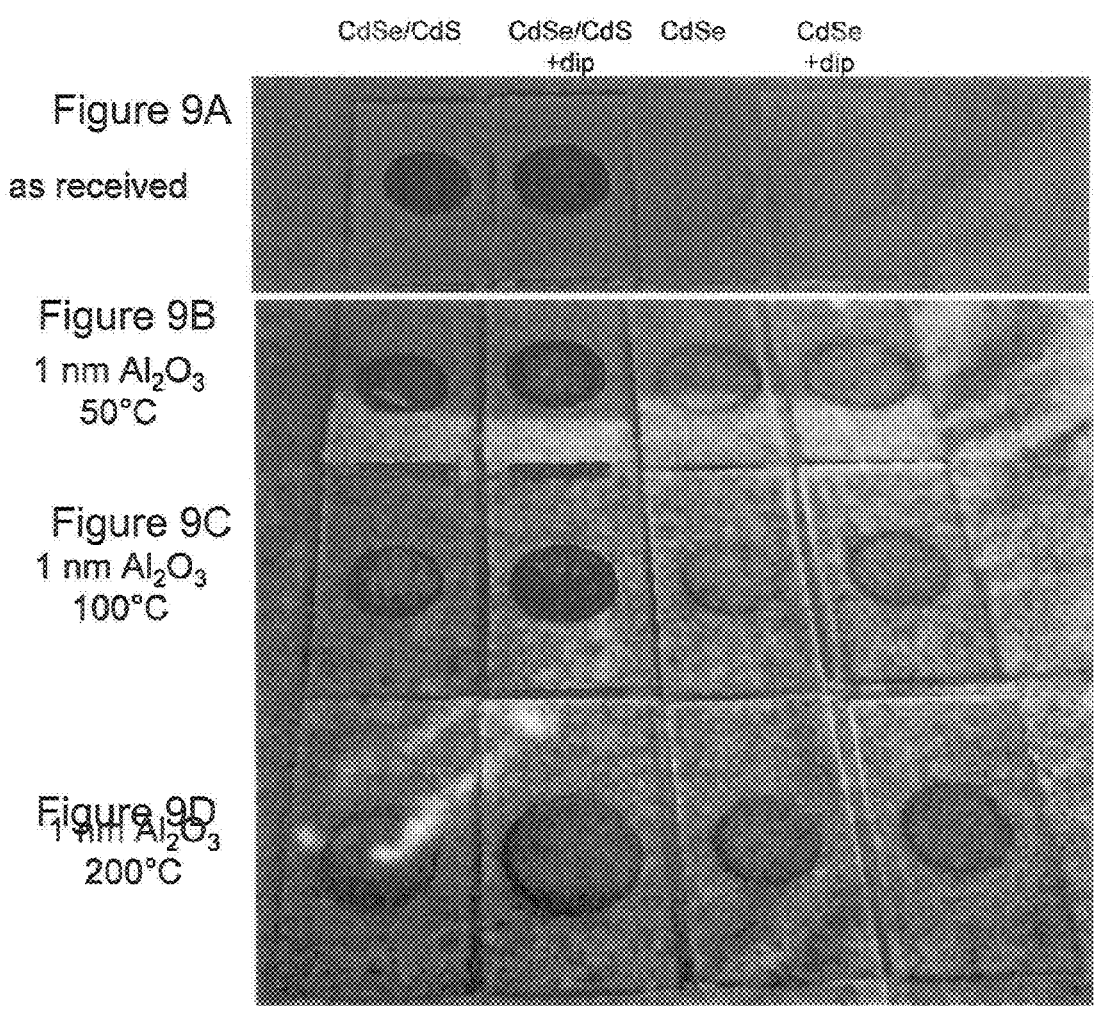
FIG. 9A shows photoluminescence of a base as received CdSe/CdS for four different conditions.
FIG. 9B shows photoluminescence of CdSe/CdS plus a dip treatment.
FIG. 9C shows photoluminescence of CdSe alone.
FIG. 9D shows photoluminescence CdSe with a dip treatment.

The colloidal dots and core/shells are synthesized following slight modifications of a conventional procedure (see FIG. 8). As synthesized, the dot solutions have a large excess of non-volatile hydrocarbons. These hydrocarbons are first cleaned off by an initial precipitation and centrifugation with ethanol. The dots are then further cleaned by re-dissolving the precipitate in $CCl_4$, with 0.2 vol % tri-n-octylphosphine (TOP) and tri-n-octylphosphine oxide (TOPO) dissolved, followed by centrifugation, transfer of the clear quantum dot solution to a clean test-tube and precipitation with ethanol by centrifugation. This is repeated twice. Finally, the precipitate is dried and redissolved in a mixture of hexane and octane (9:1). This solution is then centrifuged and filtered. Drop-casting leads to clear dry films between 50 and 80 nm thick and an optical density of 0.01 to 0.05 at the exciton peak (the smaller value is for core/shells).

Such films are highly insulating and exhibit no observable photoconductivity at the applied bias (<1 V/µm). The films are then dipped in a solution of 3 wgt % $NH_4OH$ in ethanol for some time. For the films, photoluminescence is excited with a 400 nm flashlight and detected with a fiber optic spectrometer. The ALD is performed in a small quartz tube chamber with a base pressure of less than 100 mTorr provided by a mechanical pump and liquid nitrogen trap. The valves are manual and a $N_2$ flow maintains the pressure at 1 Torr. Diethyl zinc (Strem Chemical) is let in by opening a valve for 1 second. The pressure rises briefly to 2 Torr. After 20 seconds, the water exposure is provided for 5 seconds at a pressure of 4 Torr. The cycle is repeated after one minute. The sample is prepared on a aluminum block heated by a cartridge heater monitored by a chromel-alumel thermocouple. The chamber allows in situ current measurements down to about 1 pA and optical access. Quartz Crystal Microbalance and in situ photoluminescence measurements are performed in the viscous flow ALD reactor shown in FIG. 2.

Example 2

In a preferred method of Example 1, a solution of tri-n-octylphosphine oxide (TOPO) at 300° C. is prepared. A solution of Cd and Se precursors (e.g. $(CH_3)_3Cd+(CH_3)_3Se$ in tri-n-octylphosphine (TOP) is prepared, and this solution is injected into the last TOPO solution. First nucleation of CdSe is obtained by thermal decomposition. The system is rapidly cooled to about 260° C. and the slow growth of CdSe quantum dots ensues. The size of the quantum dot is determined by the duration of the growth step. Specific examples are described hereinafter.

Example 3

Measurements were carried out to determine photoluminescence (PL) under 354 nm UV lamp irradiation following ALD of $Al_2O_3$ on various CdSe/CdS and CdSe quantum dots prepared in the manner described in Examples 1 and 2. As noted in FIGS. 9A-9D, various ALD temperatures were used and selected samples were subject to an $NH_4OH$ dip. Of note, is the effect of these parameters on the photoluminescence of the various specimens, and in particular, that higher ALD growth temperatures quench the photoluminescence.

Example 4

Figure 10:
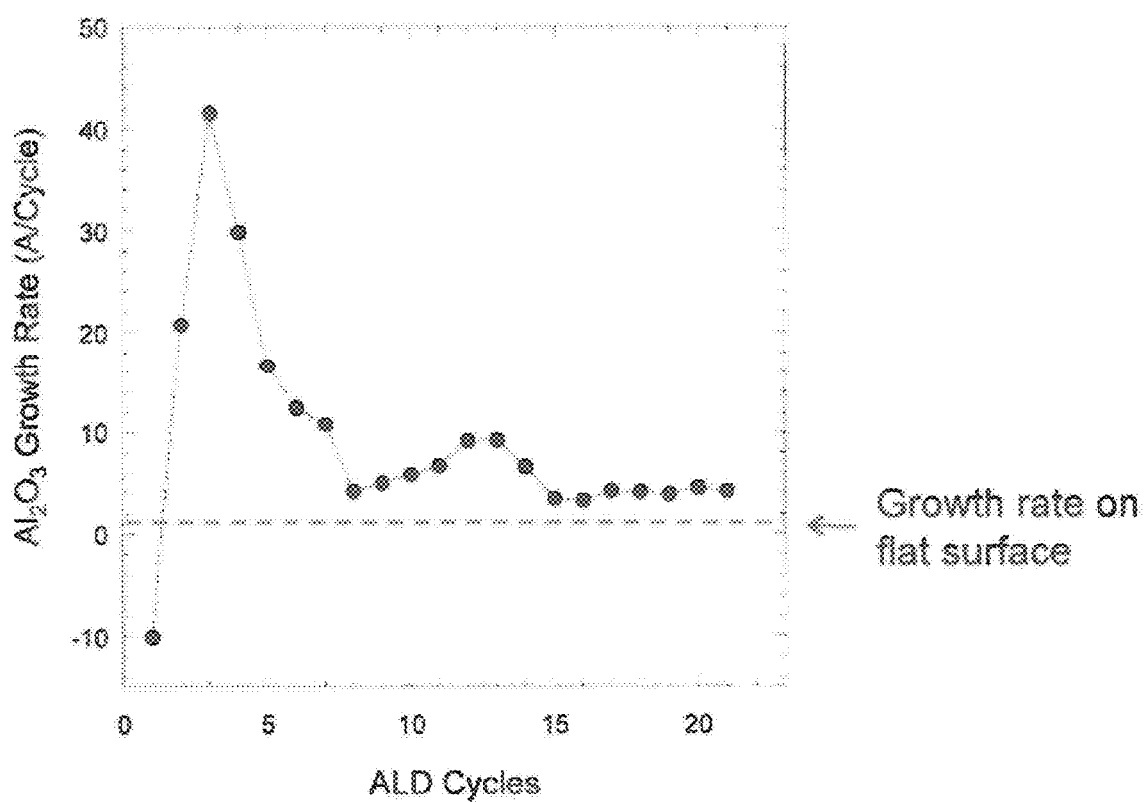
FIG. 10 shows $Al_2O_3$ growth rate for a CdS/ZnSiMn quantum dot film on a QCM sensor with about 35× enhanced growth rate versus a flat surface.
Figure 11:
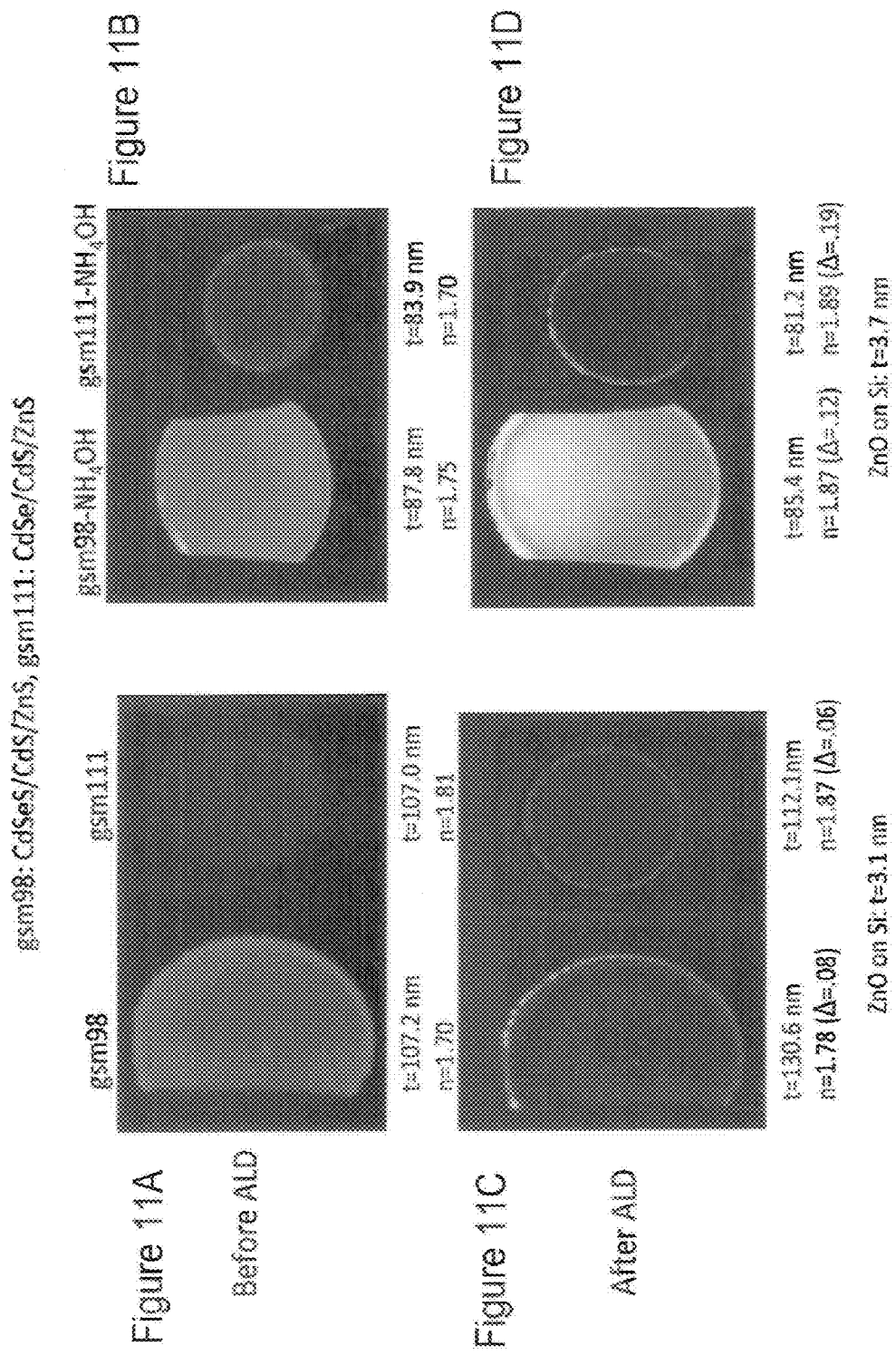
FIG. 11A shows photoluminescence performance for CdSeS/cdS/ZnS and CdSe/cdS/ZnS for thickness rated before ALD.
FIG. 11B shows the same specimens before ALD and treated with $NH_4OH$.
FIG. 11C shows the same specimens of FIG. 11A after ALD.
FIG. 11D shows the same specimens of FIG. 11B but after ALD.

The growth rate was determined for ALD deposited $Al_2O_3$ on a CdS/ZnS:Mn quantum dot film on a QCM sensor. The thickness was measured as a function of ALD deposition cycles. FIG. 10 illustrates the growth rate as a function of various numbers of cycles. The growth rate was enhanced by about 35 times versus a flat surface deposition, demonstrating that the ALD of $Al_2O_3$ infiltrates the quantum dot film to coat substantially all inner surfaces.

Example 5

This example illustrates the effect of compositional formulation for a ALD of ZnO deposited on the formulations shown in FIGS. 11A-11D. The formulation, whether there is or is not an $NH_4OH$ dip, the film thickness and the measured photoluminescence are depicted.

Example 6

Figure 12:
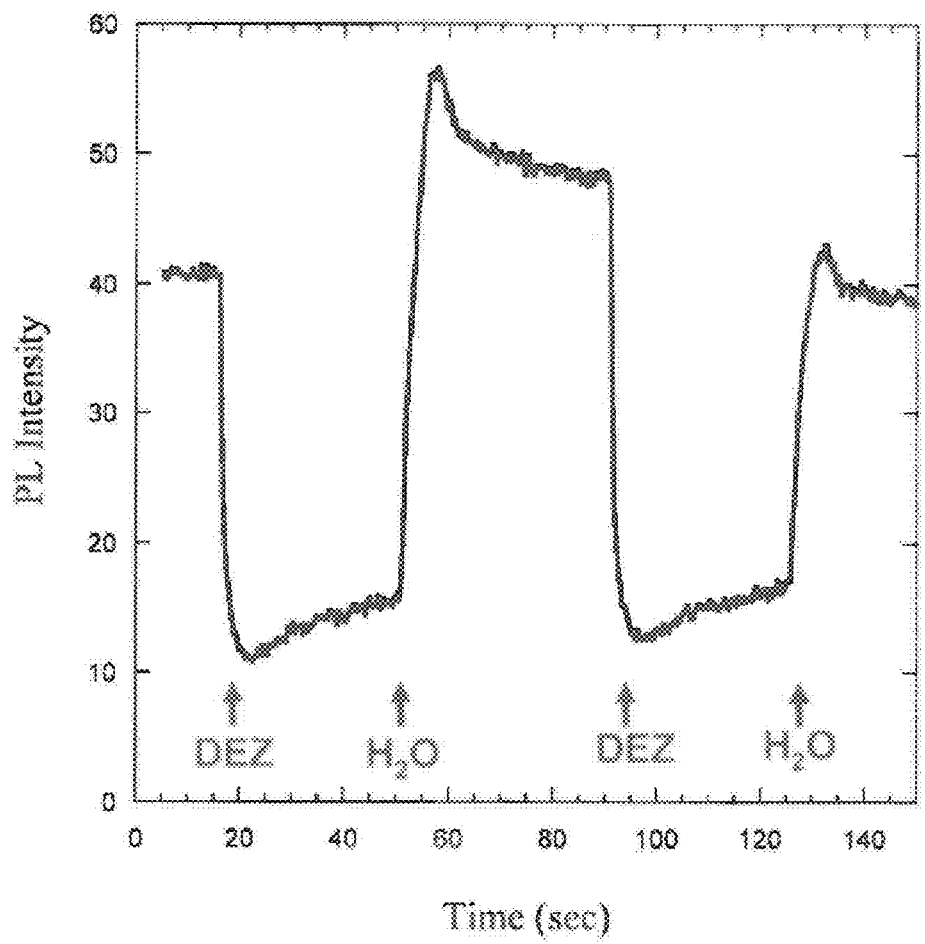
FIG. 12 shows photoluminescence following ZnO ALD deposition for CdScS/CdS/ZnS that are $NH_4OH$ treated.

Photoluminescence was measured following a ZnO ALD processing for quantum dots of CdSeS/CdS/ZnS treated by an $NH_4OH$ dip. FIG. 12 shows the intensity of the CdSeS/CdS/ZnS sample as a function of time and associated solution treatments at selected times.

Example 7

Figure 13:
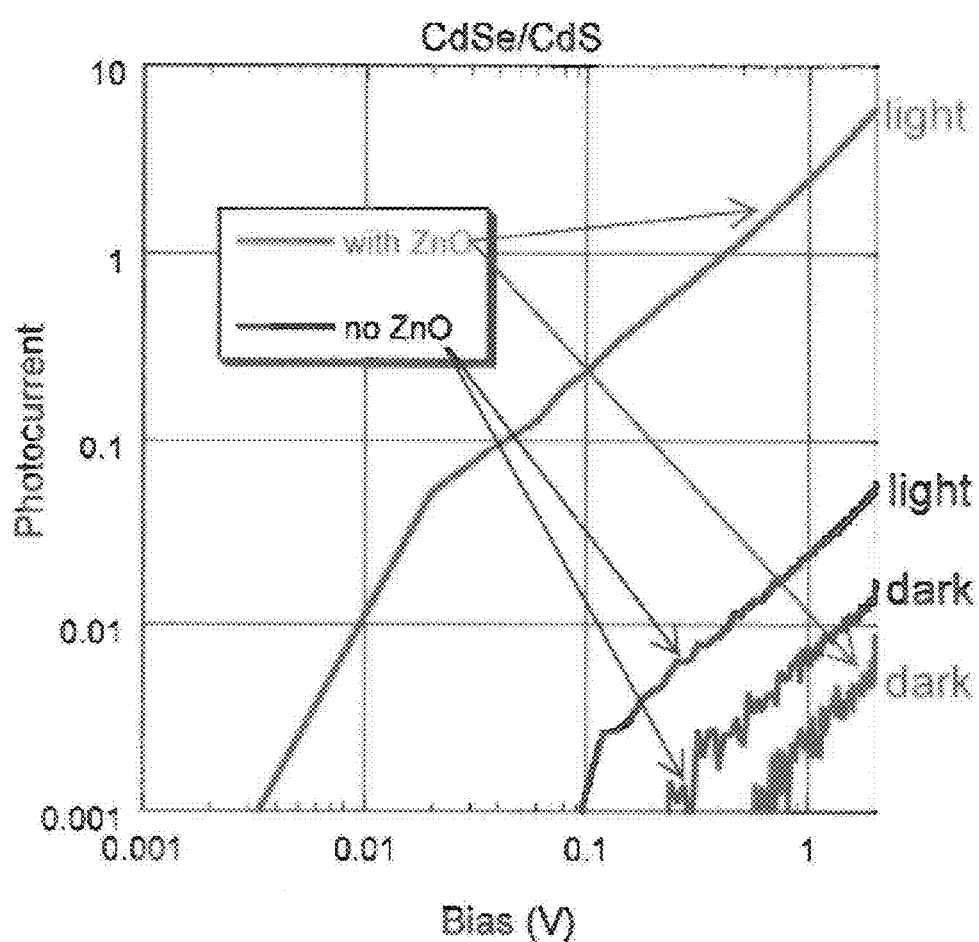
FIG. 13 shows photoconductivity of CdSe/CdS with and without ZnO as a function of bias voltage.

Photoconductivity was measured following ALD of ZnO onto CdSe/CdS (see FIG. 13). The photoconductivity is illustrated versus bias voltage for light and dark conditions and with and without ALD of ZnO layers.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention.

The embodiments were chosen and described in order to explain the principles of the present invention and its practical application to enable one skilled in the art to utilize the present invention in various embodiments, and with various modifications, as are suited to the particular use contemplated.

What is claimed is:

1. A method for preparing a functionalized nanocomposite, comprising:
providing an atomic layer deposition (ALD) system;
providing a colloidal quantum dot array comprising a semiconductor material;
providing a first precursor reactive with the semiconductor material, the first precursor comprising at least one of a metal and a metal compound, and the first precursor selected to modify at least one of an electrical and an optical property of the colloidal quantum dot array; and
exposing the colloidal quantum dot array to the first precursor within the ALD system for a first period, thereby depositing a monolayer of the first precursor over at least a portion of the semiconductor material to form a nanocomposite comprising an inorganic surface disposed over at least a portion of the semiconductor material.

2. The method of claim 1, further comprising:
providing a second precursor;
reacting the second precursor with the first precursor deposited over at least a portion of the semiconductor material for a second period; and
repeating alternating exposures of the colloidal quantum dot array to the first precursor and reaction of the second precursor with the first precursor to obtain a desired thickness of the inorganic surface disposed over at least a portion of the semiconductor material.

3. The method of claim 2, wherein the second precursor is selected from the group consisting of: $H_2O$ and $H_2S$.

4. The method of claim 1, wherein the metal is selected from the group consisting of: Al, Cd, Pb and Zn.

5. The method of claim 1, wherein the semiconductor comprises CdSe.

6. The method of claim 1, wherein the electrical property is selected from the group consisting of: dark current, photocurrent and photoconductivity.

7. The method of claim 6, wherein the nanocomposite is characterized by a photoconductivity of at least 50× the photoconductivity of the semiconductor material.

8. The method of claim 1, wherein the electrical property is selected from the group consisting of: photoresponse, photoluminescence and index of refraction.

9. The method of claim 8, wherein the nanocomposite is characterized by a photoresponse time at least 1000× faster than the photoresponse time of the semiconductor material.

10. The method of claim 1, further comprising treating the colloidal quantum dot array with ammonium hydroxide to remove at least a portion of hydrocarbon material disposed within the interstices of the colloidal quantum dot array.

11. A method for enhancing an electro-optical property of a nanocrystal semiconductor, comprising:
providing a nanocrystal semiconductor substantially free of interstitial contaminates;
providing a first precursor, the first precursor comprising at least one of a gas-phase metal and a metal compound;
providing a second precursor, the second precursor selected to be reactive with the first precursor;
depositing a substantially conforming layer comprising the first precursor onto the nanocrystal semiconductor;
reacting the second precursor with the first precursor of the substantially conforming layer to form a nanocomposite structure comprising a nanocrystal semiconductor having an inorganic surface layer.

12. The method of claim 11, further comprising heating the nanocomposite structure to affect a reversible alteration of at least one of an electrical and an optical property of the nanocomposite structure.

13. The method of claim 11, wherein the inorganic surface layer comprises at least one of a metal oxide, a metal sulfide, a mixed metal compound, and combinations thereof.

14. The method of claim 13, wherein the metal oxide comprises ZnO, and wherein the nanocrystal semiconductor comprises CdSe.

15. A method for preparing a functionalized nanocomposite by atomic layer deposition (ALD), comprising:
providing within an ALD reactor a colloidal quantum dot array comprising a semiconductor material;
providing a first precursor reactive with the semiconductor material, the first precursor comprising at least one of a metal and a metal compound, and the first precursor selected to modify at least one of an electrical and an optical property of the colloidal quantum dot array;
providing a second precursor selected from the group consisting of: $H_2O$ and $H_2S$; and
performing alternating exposures of the colloidal quantum dot array to the first precursor for a first period and to the second precursor for a second period, thereby depositing a monolayer of a nanocomposite comprising an inorganic surface disposed over at least a portion of the semiconductor material;
repeating the alternating exposures to obtain a desired thickness of the inorganic surface.

16. A functionalized nanocomposite having enhanced electro-optical properties comprising:
a semiconductor nanocrystal substrate and an inorganic conformal film deposited over at least a portion of the substrate via monolayer deposition, the inorganic film comprising at least one of a metal oxide and a metal sulfide,
wherein the nanocomposite is characterized by an enhancement of at least one of an electrical property and an optical property relative to the respective electrical property and an optical property relative to the respective electrical property and optical property of the semiconductor nanocrystal substrate,
wherein the nanocomposite the metal is selected from the group consisting of: Al, Cd. Pb and Zn, and
wherein the metal oxide is selected from the group consisting of $Al_2O_3$, ZnO, and combinations thereof.

17. A functionalized nanocomposite having enhanced electro-optical properties comprising:
a semiconductor nanocrystal substrate and an inorganic conformal film deposited over at least a portion of the substrate via monolayer deposition, the inorganic film comprising at least one of a metal oxide and a metal sulfide,
wherein the nanocomposite is characterized by an enhancement of at least one of an electrical property and an optical property relative to the respective electrical property and an optical property relative to the respective electrical property and optical property of the semiconductor nanocrystal substrate, and
wherein the nanocomposite is characterized by at least one of a photoresponse time of at least 1000× faster than a photoresponse time of the semiconductor nanocrystal and at least 50× a photoconductivity of the semiconductor nanocrystal.

* * * * *